(12) United States Patent
Bégon-Lours et al.

(10) Patent No.: US 12,389,815 B2
(45) Date of Patent: Aug. 12, 2025

(54) FILAMENT-METAL OXIDE CHANNEL EXCHANGE RESISTIVE MEMORY DEVICE

(71) Applicant: International Business Machines Corporation, Armonk, NY (US)

(72) Inventors: Laura Bégon-Lours, Paris (FR); Valeria Bragaglia, Zurich (CH); Jean Fompeyrine, Waedenswil (CH); Antonio La Porta, Kilchberg (CH); Mattia Halter, Zurich (CH)

(73) Assignee: International Business Machines Corporation, Armonk, NY (US)

( * ) Notice: Subject to any disclaimer, the term of this patent is extended or adjusted under 35 U.S.C. 154(b) by 1073 days.

(21) Appl. No.: 17/347,898

(22) Filed: Jun. 15, 2021

(65) Prior Publication Data

US 2022/0399497 A1 Dec. 15, 2022

(51) Int. Cl.
*H10N 70/20* (2023.01)
*H10B 63/00* (2023.01)
*H10N 70/00* (2023.01)

(52) U.S. Cl.
CPC ......... *H10N 70/8833* (2023.02); *H10B 63/80* (2023.02); *H10N 70/028* (2023.02); *H10N 70/063* (2023.02); *H10N 70/068* (2023.02); *H10N 70/841* (2023.02)

(58) Field of Classification Search
CPC .............................. H10N 70/826; H10B 63/80
See application file for complete search history.

(56) References Cited

U.S. PATENT DOCUMENTS

| 8,787,066 | B2 | 7/2014 | Wang |
| 10,312,441 | B1 | 6/2019 | Fompeyrine et al. |
| 10,516,108 | B2 | 12/2019 | Fompeyrine |
| 10,777,608 | B2 | 9/2020 | Lu |
| 11,462,585 | B2 * | 10/2022 | Lu .......................... H10B 63/22 |

(Continued)

FOREIGN PATENT DOCUMENTS

| CN | 104361908 A | 2/2015 |
| CN | 106953007 A | 7/2017 |
| CN | 108470827 A | 8/2018 |

OTHER PUBLICATIONS

Acharya, et al., "Epitaxial Brownmillerite Oxide Thin Films for Reliable Switching Memory", ACS Applied Materials and Interfaces, downloaded from the internet on Feb. 25, 2021, 10 pps., Korea, <https://pubs.acs.org/doi/abs/10.1021/acsami.6b00647>.

(Continued)

*Primary Examiner* — Mark V Prenty
(74) *Attorney, Agent, or Firm* — Edward J. Wixted, III

(57) ABSTRACT

An approach to provide a semiconductor structure for a resistive switch device. The resistive switch device includes a bottom electrode, a dielectric material over the bottom electrode, and a metal oxide material on a portion of the dielectric material connecting to a portion of a top electrode where the metal oxide material has a controlled volume. Additionally, the approach includes a plurality of the resistive switch devices in a crossbar. The crossbar array includes the plurality of resistive switch devices on more than one bottom electrode and at least one top electrode connecting to the plurality of resistive switch devices.

20 Claims, 6 Drawing Sheets

(56) References Cited

U.S. PATENT DOCUMENTS

2017/0365641 A1 12/2017 Bedau
2019/0288195 A1 9/2019 Lu

OTHER PUBLICATIONS

Beck, et al., "Reproducible switching effect in thin oxide films for memory applications", Applied Physics Letters, Jun. 28, 2000, 4 pps., <https://doi.org/10.1063/1.126902>.

Chang, et al., "Synaptic behaviors and modeling of a metal oxide memristive device", Applied Physics A Materials Science & Processing, Feb. 5, 2011, 7 pps.

Chien, et al., "A study of the switching mechanism and electrode material of fully CMOS compatible tungsten oxide ReRAM", Applied Physics A Materials Science & Processing, 2011, 7 pps.

Dirkmann, et al., "The role of ion transport phenomena in memristive double barrier devices", Scientific Reports, Oct. 20, 2016, 12 pps., <https://www.nature.com/articles/srep35686>.

Jo, et al., "Nanoscale Memristor Device as Synapse in Neuromorphic Systems", Nano Letters, 2010, 5 pps., Department of Electrical Engineering and Computer Science, University of Michigan, Michigan, <https://pubs.acs.org/doi/10.1021/nl904092h>.

Tambunan, et al., "Resistance switching in epitaxial SrCoOx thin films", Applied Physics Letters, Aug. 14, 2014, 6 pps., <https://doi.org/10.1063/1.4893323>.

Waser, et al., "Redox-Based Resistive Switching Memories—Nanoionic Mechanisms, Prospects, and Challenges", Advanced Materials, 2009, 32 pps., Germany.

Yang, et al., "Memristive devices for computing", Nature Nanotechnology, Dec. 27, 2021, 12 pps., <https://www.nature.com/articles/nnano.2012.240>.

Garbin, et al., GrenoblHfO2 Based OxRAM Devices as Synapses for Convolutional Neural Networks, IEEE Transactions on Electron Devices, Aug. 2015, vol. 62, Issue: 8, pp. 2494-2501.

Gokmen, et al., Acceleration of Deep Neural Network Training with Resistive Cross-Point Devices: Design Considerations, Frontiers in Neuroscience, Jul. 21, 2016, vol. 10, Article 333, 13 pages.

Gong, et al., Signal and Noise Extraction From Analog Memory Elements for Neuromorphic Computing, Nature Communications, May 29, 2018, 8 pages.

Hansen, K., A Reduced-Dimensional Model for Near-Wall Transport In Cardiovascular Flows, Biomechanics and Modeling in Mechanobiology, Aug. 23, 2015, vol. 15, 26 pages.

Ielmini, et al., In-Memory Computing with Resistive Switching Devices, Nature electronics, Jul. 13, 2018, vol. 1, No. 6, pp. 333-343.

Tang, et al., ECRAM as Scalable Synaptic Cell for High-Speed, Low-Power Neuromorphic Computing, IEEE International Electron Devices Meeting (IEDM), Dec. 1-5, 2018, pp. 13.1.1-13.1.4.

Wang, et al., 3D Synaptic Architecture With Ultralow Sub-10 Fj Energy Per Spike For Neuromorphic Computation, Electron Devices Meeting, 1988. IEDM '88., Feb. 2015, 28 pages.

\* cited by examiner

Table 1

| Device State A | Device Element B | Typical Resistance C |
|---|---|---|
| Set | Metal Oxide Channel | 50MΩ |
| | Dielectric Filament | 2kΩ |
| Reset | Metal Oxide Channel | 5MΩ |
| | Dielectric Filament | 20kΩ |

| METAL OXIDE SHEET RESISTANCE ($\Omega$/sq) | POST-OXIDATION REDUCTION PROCESS |
| --- | --- |
| $5 \times 10^6$ to $10 \times 10^6$ | 15 to 30 min. @ 150°C in low hydrogen reducing environment<br><br>10 to 15 min. bake, no reducing gas |
| $5 \times 10^5$ to $8 \times 10^5$ | 15 to 30 min. @ 150°C in medium hydrogen reducing environment<br><br>10 to 15 min. bake, no reducing gas |
| $1 \times 10^5$ to $5 \times 10^5$ | 15 to 30 min. @ 150°C in medium hydrogen reducing environment<br><br>10 to 15 min. bake, no reducing gas vacuum anneal |

FIG. 7

FILAMENT-METAL OXIDE CHANNEL EXCHANGE RESISTIVE MEMORY DEVICE

BACKGROUND OF THE INVENTION

The present invention relates generally to the field of semiconductor memory device technology and more particularly to resistive random-access memory devices.

Resistive random-access memory (ReRAM or RRAM) is a type of non-volatile (NV) random-access (RAM) computer memory that works by changing the resistance across a dielectric solid-state material, often referred to as a memristor. A conventional RRAM consists of a dielectric material sandwiched between two electrodes.

RRAM formation is based on the concept that a dielectric material, which is normally insulating, can be made to conduct through a filament or conduction path formed in the dielectric material after the application of a sufficiently high voltage. RRAM operation typically uses the change of resistance that occurs under the application of the applied electric field for RRAM device switching. Resistance switching has been observed in a variety of oxides, but binary metal oxides are typically preferred as a switching material for non-volatile memory applications primarily due to their compatibility with the complementary metal-oxide semiconductor (CMOS) processing.

Creating a RRAM typically involves generating oxygen vacancies, typically created at oxide bond locations, where the oxygen has been removed. The oxygen vacancies charge and drift under applied electric fields. The motion of the oxygen ions and vacancies in the oxide can be analogous to the motion of electrons and holes in a semiconductor material. A conduction path or a filament can arise from different mechanisms, including vacancy or metal defect migration. Typically, once the filament in the dielectric material is formed, the filament may be reset or broken. The reset or breaking of the filament in the dielectric material results in a high resistance. The filament can be set or re-formed by another voltage or applied electric field, resulting in a lower resistance in the dielectric material. In some cases, many current paths, rather than a single filament, can be involved in typical RRAM applications.

SUMMARY

Embodiments of the present invention provide a semiconductor structure for a resistive switch device. The resistive switch device includes a bottom electrode, a dielectric material over the bottom electrode, and a metal oxide material on a portion of the dielectric material connecting to a portion of a top electrode where the metal oxide material has a controlled volume. Additionally, embodiments of the present invention include a plurality of the resistive switch devices in a crossbar. The crossbar array includes the plurality of resistive switch devices on more than one bottom electrode and at least one top electrode connecting to the plurality of resistive switch devices.

Embodiments of the present invention provide a method of forming a resistive switch device. The method includes forming a bottom electrode in a metal layer. The method includes depositing a layer of a dielectric material, where the dielectric material is capable of generating a conduction path with an applied electric field. The method includes selectively etching the dielectric material and depositing a passivation material. Additionally, the method includes selectively etching the passivation material to expose a portion of the dielectric material and depositing a metal layer on the exposed portion of the dielectric material and over the passivation material. The method includes oxidizing the metal material forming a metal oxide material. Furthermore, the method includes reducing the metal oxide material. The method includes performing a chemical-mechanical polish to remove excess metal oxide material and forming a top electrode.

BRIEF DESCRIPTION OF THE DRAWINGS

The above and other aspects, features, and advantages of various embodiments of the present invention will be more apparent from the following description taken in conjunction with the accompanying drawings.

FIG. 7 depicts examples of the sheet resistance of a metal oxide material in the resistive switch device with the reduction processes creating the sheet resistance in accordance with an embodiment of the present invention.

DETAILED DESCRIPTION

Figure 1:
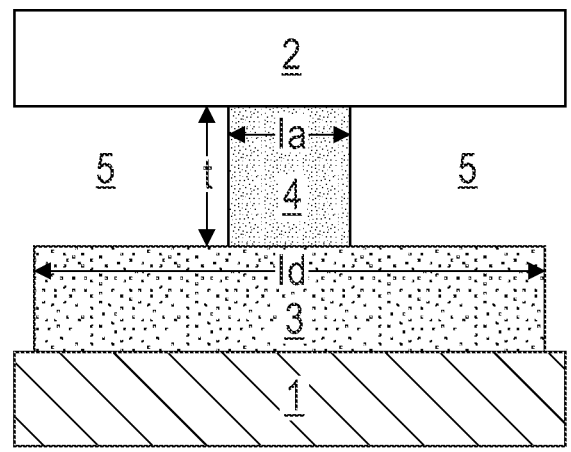
FIG. 1 is a cross-sectional view of a semiconductor structure for a resistive switch device in accordance with an embodiment of the present invention.

Embodiments of the present invention recognize that energy efficient training of artificial neural networks using back-propagation algorithms requires the use of dedicated hardware. The typical approach to run the matrix operations required for back-propagation algorithms uses crossbar arrays of memristors. When the switching characteristics in the memristors are non-ideal, the non-ideal switching limits the accuracy in the neural network training. In ideal switching, the resistive switches in the memristors provide both symmetrical and gradual switching using analog or multiple states. Embodiments of the present invention recognize that the resistive switching device or memristor in the low resistance state should be on the order of ten or more kiloohms and the maximum high resistance to several megaohms or more in order to minimize the IR (current, I and resistance, R) drop on device interconnects reducing computational precision.

Embodiments of the present invention recognize providing a new resistive switch device structure using RRAMs that function in the high resistance range can reduce device power. By Ohmic Law, one or more resistive switch devices capable of operating in a high resistance range providing megaohms of resistance would be desirable to reduce device power requirements.

Embodiments of the present invention recognize traditional semiconductor structures for memristors and/or resistive switching devices provides a blanket layer of the metal oxide over a layer of the dielectric material. In traditional memristors, there is no control of the active area responsible for the resistive switching mechanism. In these structures using blanket layers of the metal oxide over the dielectric layer, the total resistance of the resistive switching device is dominated by the filament formation in the dielectric material.

Embodiments of the present invention provide a semiconductor structure and a method of forming a resistive switch device capable of functioning in the high resistance range from hundreds of kilo ohms to many mega ohms. Embodiments of the present invention provide a resistive switching device composed of a dielectric layer and a metal oxide column between a top and a bottom electrode or terminal. The metal oxide column or pillar is constrained with a controlled cross-sectional area of the metal oxide and a controlled metal oxide thickness or height that in turn controls the volume of the metal oxide column.

Embodiments of the present invention provide a method of creating a metal oxide in the resistive switching device with tunable device resistance using a controlled metal oxide area and thickness (i.e., volume) with a metal oxide stoichiometry determined at least in part, by a post oxidation, metal oxide reduction.

Embodiments of the present invention provide a resistive switch device where the resistance of the metal oxide is controlled by controlling the volume of the metal oxide and the stoichiometry of the metal oxide. Furthermore, the resistance of the metal oxide in the resistive switching device dominates or largely determines the total resistance of the resistive switch device. The resistance of the filaments formed in the dielectric material is much less than the resistance of the metal oxide in the device.

Additionally, embodiments of the present invention provide a resistive switch device where upon the application of an electric field, oxygen vacancies diffuse from the bottom electrode though the filament in the dielectric material and through metal oxide channel to the top electrode in a reversable way. Furthermore, the total resistance of resistive switching device varies as both the resistance of the filament and the metal oxide channel vary upon oxygen vacancy exchange. In this way, both the low resistive state as well as the amplitude of the modulation of the total resistance in the resistive switch device are controllable, at least in part, by cross-sectional area and length of the metal oxide channels where the length of the metal oxide channel that has to be approximately equal to or greater than the area of the metal oxide. The length of the metal oxide channel can be determined by the thickness of the passivation which determines the thickness or height of the metal oxide from the top of the dielectric material to the bottom of the top electrode.

Embodiments of the present invention provide a method of forming a resistive switch device. The method includes forming a bottom electrode in a metal layer of a semiconductor structure. The metal layer is one of a metal layer in a front end of line (FEOL) metal layer, a middle of line (MOL) metal layer, or a backend of the line (BEOL) metal layer. In some embodiments of the present invention, the bottom electrode is formed on a deposited metal line over a FEOL, MOL, or BEOL metal layer. The method includes forming the bottom electrode using known semiconductor electrode formation processes that include patterning the bottom electrode using photolithography and either a wet or dry etch process to form the bottom electrode.

The method includes depositing and forming a dielectric material layer on the bottom electrode. A layer of a high k dielectric material that is capable of generating oxygen vacancies that form a conductive path, such as a filament under an applied electric field or voltage is deposited. The dielectric material layer is patterned and selectively etched to cover, at least in part, the bottom electrode.

The method includes depositing a layer of a passivation material over the dielectric material and exposed surfaces of the bottom electrode. The passivation material is patterned and etched to remove a portion of the passivation over the dielectric material. A deposition of a metal layer over the exposed portion of the dielectric material and the passivation occurs using known semiconductor deposition processes. Embodiments of the present invention include a chemical-mechanical polish that removes the excess metal from the metal layer from the top surface of the passivation material.

The method includes oxidizing the remaining portion of the metal layer in the passivation material using an oxidation process, such as a bake in an oxygen containing environment that is followed by a reduction of the remaining metal oxide using one or more reduction processes in an oxygen-free environment with an additional a low temperature bake and in some cases, an additional vacuum anneal. After metal oxide reduction processes, the method includes forming a top electrode on the metal oxide and over a portion of the passivation material to complete the resistive switch device. An alternative method of forming the resistive switch device is disclosed in embodiments of the present invention.

Embodiments of the present invention provide a semiconductor structure for a resistive switch device and a method of forming the resistive switch device where a resistance of the metal oxide material in the resistive device is the major contributor to a high resistance resistive switch. Embodiments of the present invention provide a method of forming the metal oxide material in the resistive switch device where the resistance of the metal oxide material is determined, at least in part, by the radius or width of the controlled volume of the metal oxide, the thickness or height of the metal oxide embedded in the passivation material, the volume of the metal oxide material in the passivation material, and the reduction processes applied to the metal oxide material in the passivation material. Additionally, embodiments of the present invention include using a number of the resistive switch devices in a crossbar array.

Detailed embodiments of the claimed structures and methods are disclosed herein. The method steps described below do not form a complete process flow for manufacturing integrated circuits, such as, semiconductor devices. The present embodiments can be practiced in conjunction with the integrated circuit fabrication techniques currently used in the art, for magnetic tape heads, and only so much of the commonly practiced process steps are included as are necessary for an understanding of the described embodiments. The figures represent cross-section portions of a RRAM device after fabrication and are not drawn to scale, but instead are drawn to illustrate the features of the described embodiments. Specific structural and functional details disclosed herein are not to be interpreted as limiting, but merely as a representative basis for teaching one skilled in the art to variously employ the methods and structures of the present disclosure. In the description, details of well-known features and techniques may be omitted to avoid unnecessarily obscuring the presented embodiments.

References in the specification to "one embodiment", "other embodiment", "another embodiment", "an embodiment", etc., indicate that the embodiment described may include a particular feature, structure or characteristic, but every embodiment may not necessarily include the particular feature, structure or characteristic. Moreover, such phrases are not necessarily referring to the same embodiment. Further, when a particular feature, structure, or characteristic is described in connection with an embodiment, it is understood that it is within the knowledge of one skilled in the art to affect such feature, structure or characteristic in connection with other embodiments whether or not explicitly described.

For purposes of the description hereinafter, the terms "upper", "lower", "right", "left", "vertical", "horizontal", "top", "bottom", and derivatives thereof shall relate to the disclosed structures and methods, as oriented in the drawing figures. The terms "overlying", "atop", "over", "on", "positioned on" or "positioned atop" mean that a first element is present on a second element wherein intervening elements, such as an interface structure, may be present between the first element and the second element. The term "direct contact" means that a first element and a second element are connected without any intermediary conducting, insulating or semiconductor layers at the interface of the two elements.

In the interest of not obscuring the presentation of the embodiments of the present invention, in the following detailed description, some of the processing steps, materials, or operations that are known in the art may have been combined together for presentation and for illustration purposes and in some instances may not have been described in detail. Additionally, for brevity and maintaining a focus on distinctive features of elements of the present invention, description of previously discussed materials, processes, and structures may not be repeated with regard to subsequent Figures. In other instances, some processing steps or operations that are known may not be described. It should be understood that the following description is rather focused on the distinctive features or elements of the various embodiments of the present invention.

FIG. 1 is a cross-sectional view of the semiconductor structure for resistive switch device 100 in accordance with an embodiment of the present invention. As depicted, FIG. 1 includes resistive switch device (RSD) 100 with bottom electrode 1, dielectric material 3, metal oxide 4, passivation 5, and top electrode 2. FIG. 1 also depicts a height or thickness of metal oxide 4 as "t", a length of dielectric material 3 on bottom electrode 1 as distance $l_d$ and depicting a length of an active area in metal oxide 4 as distance $l_a$. Distance $l_a$ depicts the width of the active area in metal oxide 4 in RSD 100. For example, an active area of a square metal oxide column would be distance $l_a^2$ and an active area of a round pillar of metal oxide 3 in FIG. 1 would be $\pi r^2$ or $\pi$ (distance $l_a/2)^2$. The shape of the active area of metal oxide 4 contacting dielectric material 3 can be any shape contact area.

Metal oxide 4 creates a channel for oxygen vacancies to travel in RSD 100. In various embodiments, the volume of metal oxide 4 is determined, at least in part, by the magnitude of $l_a$. Metal oxide 4 provides the largest component of the total resistance of the RRAM in RSD 100 (e.g., the total resistance of the RRAM in RSD 100 includes the resistance of a constrained volume of metal oxide 4 and the resistance of the filament in dielectric material 3 connecting bottom electrode 2 to metal oxide 4).

Bottom electrode 1 can be an electrode formed in or on a metal layer deposited over a semiconductor substrate (not depicted). For example, bottom electrode 1 is formed in or on a portion of a metal layer that can be a portion of a metal layer formed in one of a front-end of the line (FEOL) process, a middle-of-the line (MOL) process, or a back-end-of-the line (BEOL) process of semiconductor manufacture. For example, bottom electrode 1 can be in or above the M1 metal layer. In some embodiments, an underlying semiconductor device, such as a metal-oxide-semiconductor field-effect transistor (MOSFET) device, or CMOS device based on various architectures such as a planar-FET, FinFET, horizontal Gate-All-Around (h-GAA) FET or vertical Gate-All-Around (v-GAA) FET, etc. may reside under bottom electrode 1 in RSD 100 and in some cases, connects to bottom electrode 1.

Bottom electrode 1 is a conductive electrode material. For example, bottom electrode 1 may be composed of, but is not limited to, titanium (Ti), titanium nitride (TiN), tungsten (W), tungsten nitride (WN), tantalum nitride (TaN), tungsten carbide (WC), copper (Cu), copper alloys (e.g., Cu—Ti), ruthenium (Ru), aluminum (Al), metal oxides, such as $RuO_3$ or indium tin oxide (ITO), alloys of more than one these material, or a multilayered stacks of more than one of these electrode materials. Bottom electrode 1 can be formed with known electrode formation processes, such as photolithography and etch of a deposited metal layer to form bottom electrode 1. Top electrode 2 can be formed with essentially the same or similar electrode materials and processes as bottom electrode 1. In various embodiments, top electrode 2 is above metal oxide 4 and a portion of passivation 5. Top electrode 2 can be formed in a deposited metal layer that is above bottom electrode 1 (e.g., top electrode 2 can be in or on a portion of a FEOL, MOL, or BEOL metal layer, such as M1 or M2). As depicted, passivation 5 is under top electrode 2 and over exposed portions of dielectric material 3. Passivation 5 surrounds metal oxide 4. Passivation 5 can be a dielectric material, such as silicon dioxide $(SiO_2)$, $Si_3N_4$, or $Al_2O_3$ but, is not limited to these materials.

Figure 2:
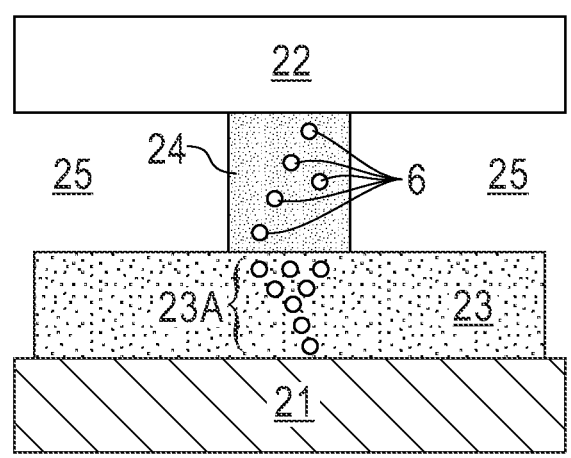
FIG. 2 is a cross-sectional view of the semiconductor structure of a resistive switch device in a first resistive state in accordance with an embodiment of the present invention.

In various embodiments, dielectric material 3 is a dielectric material capable of exhibiting the non-volatile resistance switching with an applied electric field or applied voltage. For example, dielectric material 3 can generate a conduction path or a conductive filament in through dielectric material 3 when an applied electric field or voltage is sufficiently large. The applied voltage to generate a filament in $HfO_2$, for example, can be in the range of 1.5 to 8 V but, this range can vary with different dielectric materials. In various embodiments, dielectric material 3 is a high k dielectric material. For example, dielectric material 3 can be composed of a titanium oxide (e.g., $TiO_2$), a hafnium oxide (e.g., $HfO_2$), cerium oxide (e.g., Ce 02), or another rare earth oxide but is not limited to these materials or these specific compounds. A typical thickness of dielectric material 3 is 5 to 25 nm but, the thickness of dielectric material 3 is not limited to this range of thickness. As depicted, dielectric material 3 resides on bottom electrode 1 and under metal oxide 4 and under passivation 5. Metal oxide 4 covers a portion of the top surface of dielectric material 3. In various embodiments, an exchange of oxygen vacancies occurs through a filament in dielectric material 3 created by the application of an electric field applied from bottom electrode 1 to top electrode 2 or from top electrode 2 to bottom electrode 1. The filament provides a conductive path between bottom electrode 1 and metal oxide 4. An example of a filament formed in dielectric material 3 is depicted in FIG. 2.

Metal oxide 4 resides on a portion of dielectric material 3 and under top electrode 2. As depicted, metal oxide 4 is surrounded by passivation 5. In various embodiments, metal oxide 4 is formed with a controlled geometry. For example, a cross-sectional area of metal oxide 4, when metal oxide 4 is a round or square column, can be a controlled width depicted as distance $l_a$ and a controlled thickness, t, depicted in FIG. 1. In embodiments of the present invention, metal oxide 4 is formed with tunable stoichiometry using various reducing or heating processes that result in different sheet resistances in metal oxide 4. For example, applying different heat treatments and reducing environments can significantly change the sheet resistivity of metal oxide 4 by two to three orders of magnitude as depicted later in FIG. 7.

Metal oxide 4 can be composed of a metal oxide material, such as but not limited to a tungsten oxide ($WO_x$), a TaOx, or a CeOx, TiOx where x is an integer or a portion of a number (e.g., 2 or 3.3). Metal oxide 4 with an active area determined, at least in part, by distance $l_a$ of the area or portion of metal oxide 4 in contact with dielectric material 3, provides the active area in RSD 100 responsible for the resistive switching mechanism. In other words, the amount of area of metal oxide 4 in contact with dielectric material 3 and top electrode 2 along with the thickness of metal oxide 4 (e.g., the height of the column of metal oxide 4) are critical factors in determining the volume of metal oxide 4 and the resulting resistance of metal oxide 3. The distance $l_a$ can be the width of a square or a round contact area of metal oxide 4 to dielectric material 3. Distance $l_a$ typically ranges from 7 nm to 100 nm but, is not limited to this range. In some examples, the area of metal oxide 4 in contact with dielectric material 3 is determined by two-dimensions (e.g., when the contact area is a rectangle, an oval, or other shape).

A typical thickness t of metal oxide 4 ranges from 5 to 50 nm but, is not limited to these thicknesses. In various embodiments, the thickness, t of metal oxide 4 is equal to or less than distance $l_a$ that determines, at least in part, the active area of the portion of metal oxide 4 in contact with dielectric material 3.

One method of determining the total of RRAM resistance in a resistive switch device includes determining the resistance of the metal oxide and the resistance of the filaments forming in the dielectric material between bottom electrode 1 and the metal oxide. If we assume that the resistance of the filament is fixed, the increase in total resistance of the RRAM in using the structure of RSD 100 in FIG. 1 when compared to the total resistance of the RRAM in a traditional or prior art resistive switch device can be determined using the change in area or volume of metal oxide of the controlled area and volume metal oxide 4 of RSD 100 verses a blanket metal oxide (not depicted) that covers dielectric material 3 in the traditional or prior art resistive switch device (not depicted).

In a prior art resistive switch device using a bilayer structure, the dielectric material (e.g. dielectric material 3) is completely covered with a blanket or layer of a metal oxide (e.g., metal oxide 4) and the area of the metal oxide material in the RRAM is distance $l_d^2$ or the same as the area of dielectric material 3. As depicted in FIG. 1, the area of metal oxide 4 in RSD 100 is $l_a^2$. This area calculation assumes a square shape for metal oxide 4 and dielectric material 3 however, the area of metal oxide 4 could be the area of a circle in a via or a column (e.g., $a=\pi r^2$). The portion of metal oxide 4 contacting dielectric material 3 can be any shape (e.g., a circle, a square, an oval, etc.).

For example, using the following equations and assuming a square contact area of metal oxide 4 on dielectric material 3 for RSD 100 as formed (i.e., without an applied electric field):

$$R_{RRAM} = R_{filament} + R_{MO} \quad (1)$$

$$\text{(Prior Art) } R_{MO} = \rho_{MO}(t/\text{distance } l_d^2)* \quad (2)$$

$$\text{(RSD 100) } R_{MO} = \rho_{MO}(t/\text{distance } la^2)* \quad (3)$$

$$\text{(Prior Art) } R_{MO}/(\text{RSD}) R_{MO} = \text{distance } l_d^2/\text{distance } l_a^2 \quad (4)$$

where $\rho_{MO}$ is the resistivity of the metal oxide (i.e., metal oxide 4)
   t is the thickness of the layer of the metal oxide
   distance $l_d$ is the length of the dielectric material (i.e., dielectric material 3)
   distance $l_a$ is the length of the active area in metal oxide 3
   $R_{filament}$ is constant for these situations and approximately, 2 k$\Omega$
   $R_{MO}$ is the resistance of the metal oxide material
   $R_{RRAM}$ is the resistance of the RRAM
   dielectric material 3 and metal oxide 4 are assumed to have a square shape where distance $l_d^2$ and distance $l_a^2$ are the respective areas of the dielectric material and the metal oxide Assuming the same filament resistance, $R_{filament}$ for both the traditional, prior art RRAM using a blanket of metal oxide covering dielectric material 3 (i.e., distance $l_a$=distance $l_d$) and RSD 100 with a controlled width metal oxide 4 where the width of metal oxide 4, distance $l_a$ is less than the width of dielectric material 3 depicted as distance $l_d$, using the equations above, the increase in $R_{MO}$ in RSD 100 can increase by a factor of distance $l_d^2$ divided by distance $l_a^2$.

Looking at a specific example that assumes a strong filament with a resistivity, $R_{filament}$ that is 2 k$\Omega$ for both the prior art RRAM and RSD 100 and using 20 nm thick (t=20 nm), semi-insulating metal oxide for metal oxide 4 with $\rho_{MO}$ that is 1 $\Omega$m, distance $l_d$ of 10 μm and distance $l_a$ of 20 nm for RSD 100, the resulting $R_{MO}$ for the prior art would be 200 k$\Omega$ and the $R_{MO}$ for RSD 100 would be 50 Me. In this example, $R_{MO}$ for RSD 100 is much greater than $R_{MO}$ for the prior art resistive switch structure with a blanket metal oxide. Additionally, in this example, $R_{RRAM}$ in RSD 100 is dominated by the resistance of metal oxide 4 (i.e., $R_{MO}$ for RSD 100=50 M$\Omega$ and $R_{RRAM}$ is 50 M$\Omega$+2 k$\Omega$ for RSD 100).

RSD 100 has a smaller area than the area of the prior art RRAM where the width of the metal oxide is equal to the width of dielectric material 3. Assuming the same $R_{filament}$ for both RSD 100 and the prior art resistive switch device, RSD 100 has a significantly higher $R_{RRAM}$ (approximately, 50 M$\Omega$) versus the resistance of the traditional, prior art structure with a lower $R_{RRAM}$ (approximately, 52 k$\Omega$). Using equation (1) with the example above, $R_{RRAM}$ for RSD 100 is dominated or dictated by the resistance $R_{MO}$ of metal oxide 4 (e.g., $R_{MO}$=50 Me).

Additionally, comparing $R_{MO}$ of the prior art with a blanket metal oxide over dielectric material 3 to the $R_{MO}$ of RSD 100, using equation (4) above, $R_{MO}$ in RSD 100 is increased by a factor of distance $l_d^2$/distance $l_a^2$ over $R_{MO}$ of the prior art resistive switch. With equation (1) assuming the same $R_{filament}$ for both the prior resistive switch and RSD 100, RSD 100 $R_{RRAM}$ is much greater than $R_{RRAM}$ of the prior art structure. With the specific example above, (e.g., $R_{filament}$ of 2 K$\Omega$, $\rho_{MO}$ of 1 $\Omega$m, distance $l_d$ of 10 μm and distance $l_a$ of 20 nm), RSD 100 $R_{RRAM}$ is approximately 50 Me and the prior art $R_{RRAM}$ would be much less with approximately, 202.2 k$\Omega$. As deposited, RSD 100 in FIG. 1 is in a high resistance or OFF state. In the OFF state, the resistance of the metal oxide is high and the filament resistance is low (i.e., the filament is thick).

FIG. 2 is a cross-sectional view of RSD 200 in a first resistive state in accordance with an embodiment of the present invention. As depicted, FIG. 2 of RSD 200 includes bottom electrode 21, dielectric material 23 with filament 23A formed by oxygen vacancies 6, metal oxide 24 with oxygen vacancies 6, passivation 25, and top electrode 22. Bottom electrode 22, dielectric material 23, metal oxide 24, passivation 25, and top electrode 22 are essentially the same as bottom electrode 1, dielectric material 3, metal oxide 4, passivation 5, and top electrode 2 with the exception of the oxygen vacancies 6 depicted in dielectric material 3 and metal oxide 4. When an electric field directing or pointing from bottom electrode 21 to top electrode 22 is applied, oxygen vacancies 6 can occur, as depicted in FIG. 2.

When the electrical field from bottom electrode 21 going to top electrode 22 is applied, a thin filament, such as filament 23A forms. The thin filament 23A has a high resistance. The thin, high resistance filament 24A in dielectric material 23 is in series with metal oxide 24. When the thin, high resistive filaments 24A form in dielectric material 23, oxide 24 has a low oxygen vacancy level (e.g., not many oxygen vacancies 6 are present in metal oxide 24). Metal oxide 24, in this example, is in a low resistance state. As previously discussed, metal oxide 4 resistance provides a very large portion of the total RRAM resistance (e.g., $R_{MO}$ dominates $R_{RRAM}$). Therefore, when metal oxide 4 is in the low resistance state, RSD 200 is in the low resistance state. The low resistance state of RSD 200 may also be known as the SET state for the switch.

Figures 3, 4:
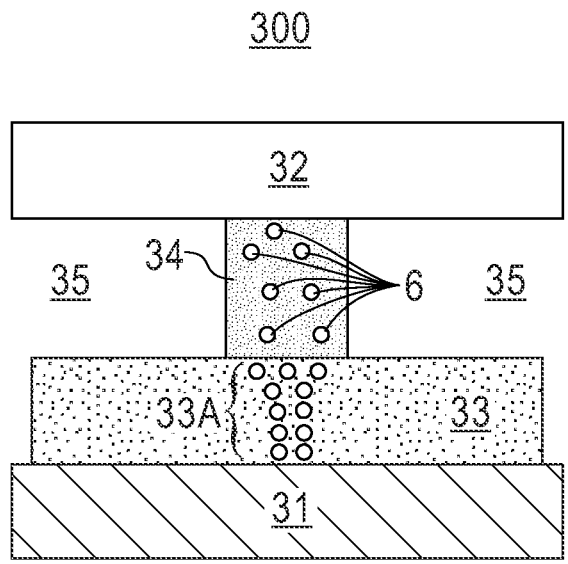
FIG. 3 is a cross-sectional view of the semiconductor structure of a resistive switch device in a second resistive state after forming a magnetoresistive random-access stack on the layer of dielectric material in accordance with an embodiment of the present invention.
FIG. 4 is a table depicting the typical resistance values of the device elements of the resistive switch device RRAM in various device states in accordance with an embodiment of the present invention

FIG. 3 is a cross-sectional view of RSD 300 in a second resistive state in accordance with an embodiment of the present invention. As depicted, FIG. 3 of RSD 300 includes bottom electrode 31, dielectric material 3 with filament 33A formed by oxygen vacancies 6, metal oxide 34 with oxygen vacancies 6, passivation 35, and top electrode 32. Bottom electrode 31, dielectric material 33, metal oxide 34, passivation 35, and top electrode 32 are essentially the same as bottom electrode 1, dielectric material 3, metal oxide 4, passivation 5, and top electrode 2 with the exception of oxygen vacancies 6 depicted in dielectric material 3 and metal oxide 4. In FIG. 3, oxygen vacancies 6 can occur when the applied electric field is directed from top electrode 32 to bottom electrode 31. When the electrical field from top electrode 32 to bottom electrode 31 is applied, a thick filament, such as filament 33A with a high resistance forms in dielectric material 33.

Filament 34A, as depicted, is in series with metal oxide 34. When the thick, low resistance filament 34A in dielectric material 33 forms, metal oxide 34 can have a high oxygen vacancy level (e.g., many oxygen vacancies 6 are present in metal oxide 34). Metal oxide 34 with a high oxygen vacancy level provides a high resistance. As previously discussed, metal oxide 34 provides the largest contribution to $R_{RRAM}$ and therefore, when the resistance is high in metal oxide 34, RSD 300 as depicted in FIG. 3, is in the high resistance state. The high resistance state may also be known as the RESET state of a switch.

FIG. 4 is Table 1 depicting TYPICAL RESISTANCE VALUES C of DEVICE ELEMENTS B of the RRAM in the resistive switch device with various applied electrical fields in accordance with an embodiment of the present invention. As depicted, FIG. 4 includes DEVICE STATE A, DEVICE ELEMENT B, and TYPICAL RESISTANCE C in TABLE 1 for a resistive switch device with different applied electric fields. The different applied electric fields generate different device states in the resistive switch device.

When the applied electric field points from the bottom electrode to the top electrode as previously depicted in FIG. 2 with RSD 200, the DEVICE STATE A of TABLE 1 is in a low resistance or SET state (the first row of TABLE 1). As depicted in TABLE 1, in the "SET" DEVICE STATE A, the dielectric filament in DEVICE STATE B has TYPICAL RESISTANCE C of 20 kΩ. In this example, the dielectric filament is thin with a high resistance (e.g., there is a small filament contact area or a small effective active area with metal oxide for oxygen vacancy exchange) and the oxygen content of the metal oxide channel (e.g., metal oxide 24 in FIG. 2) is low and the resistance of the metal oxide channel under DEVICE ELEMENT B of TABLE 1 is low. In this example, as depicted in the third column of TABLE 1, TYPICAL RESISTANCE C the metal oxide channel in the SET state is approximately 5 MΩ

When the applied electric field points from the top electrode to the bottom electrode as previously depicted in FIG. 3 with RSD 300, the DEVICE STATE A of TABLE 1 is in a high resistance or RESET state (the first row of TABLE 1). In the RESET state, for the dielectric filament in DEVICE ELEMENT B of TABLE 1, the TYPICAL RESISTANCE C in the third column of TABLE 1 is 2 kΩ. In this example, the dielectric filament is thick with a low resistance (e.g., there is a large filament contact area or a large effective active area with metal oxide for oxygen vacancy exchange), then the oxygen content of the metal oxide channel (e.g., metal oxide 34 in FIG. 3) is high and the resistance of the metal oxide channel in under DEVICE ELEMENT B of TABLE 1 is low. In this example, as depicted in TYPICAL RESISTANCE C of TABLE 1 (i.e., the third column of TABLE 1) is 50 MΩ in the RESET DEVICE state.

Figure 5:
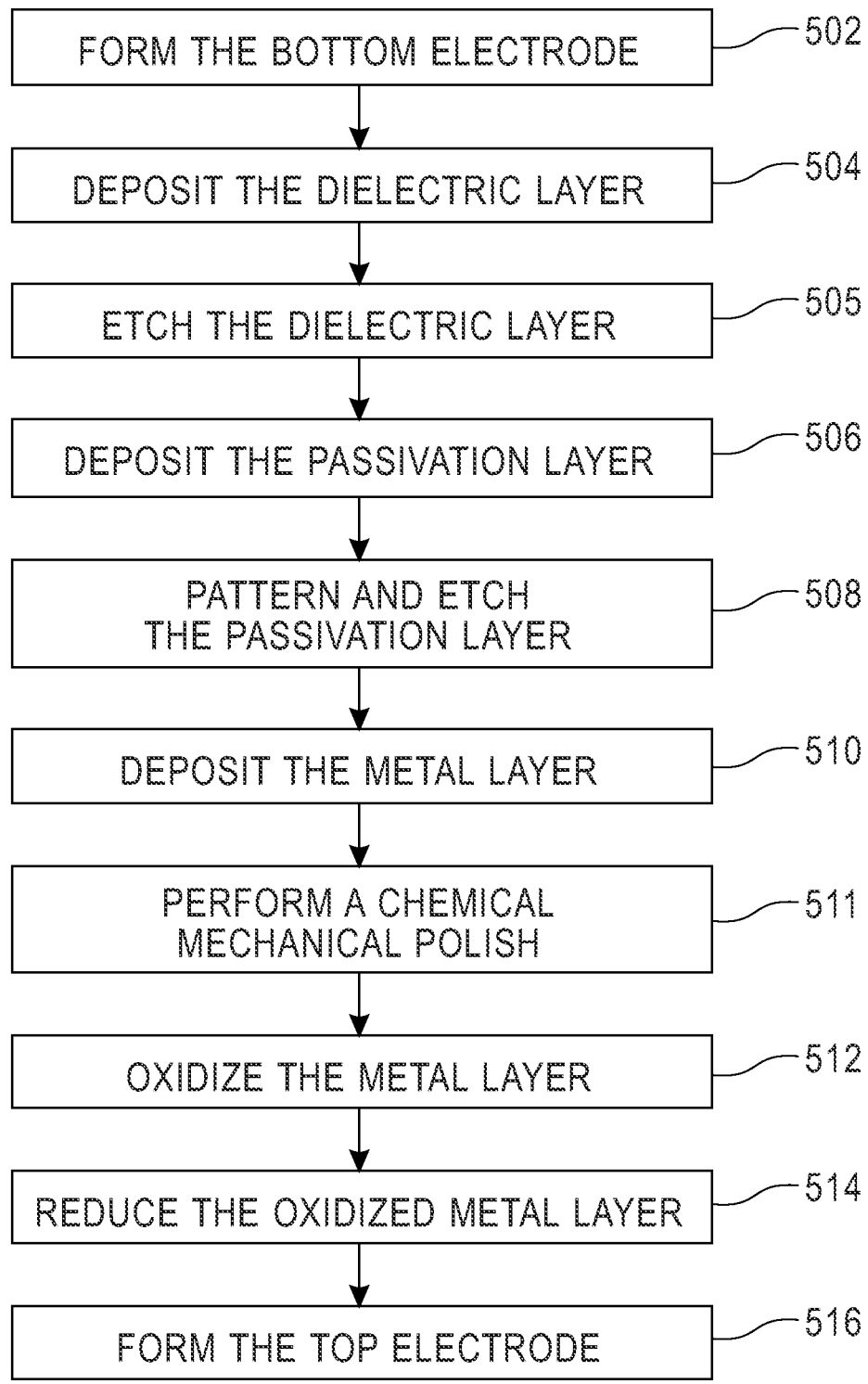
FIG. 5 is a flow chart depicting an example of the high-level process steps to form the resistive switch device in accordance with an embodiment of the present invention.

FIG. 5 is a flow chart depicting an example of the high-level process steps to form RSD 100 in accordance with an embodiment of the present invention. As previously discussed with respect to FIG. 1, RSD 100 is formed above a semiconductor substrate in or above a metal layer in one or more of the MOL, FEOL, or the BEOL.

In step 502, the method includes forming a bottom electrode using conventional semiconductor manufacturing processes. A metal layer of an electrode material, such as but not limited to Ti, TiN, W, WN, TaN, WC, Cu, or Ru may be deposited using conventional deposition processes, such as but, not limited to chemical vapor deposition (CVD), physical vapor deposition (PVD), plasma enhanced CVD (PECVD), atomic layer deposition (ALD), etc. The bottom electrode can be formed by patterning the metal layer and selectively etching portions of the metal layer using photolithography and a wet or dry etch process, such as reactive ion etch (RIE).

In step 504, the method includes depositing a dielectric layer. Using one of the deposition processes of step 502, a layer of a dielectric material is deposited over the bottom electrode in the semiconductor structure. The dielectric layer may be deposited with a thickness of 5 to 25 nm but, may deposited as a thinner or thicker layer in some embodiments. In various embodiments, the deposited dielectric material is a material suitable of forming a layer of a resistive material in a RRAM for the resistive switch device, such as RSD 100. The deposited dielectric material is a high k dielectric material, such as $Ti_xO_y$, $HG\,O_y$, $Ce_xO_y$ or another rare earth oxide where x and y are numbers (e.g., 1, 1.5, 2, etc.) but is not limited to these materials.

In step 505, the method includes etching the dielectric material. The dielectric material can be patterned and selectively etched using photolithography and a dry or wet etch process. After the selective etch, the remaining portion of the dielectric layer is above the bottom electrode. The remaining portion of the dielectric layer can be the same size or slightly smaller than the bottom electrode.

In step 506, the method includes depositing a passivation layer. The passivation layer can be a dielectric layer, such as $SiO_2$ or another interlevel dielectric material suitable for forming a passivation layer in the resistive switch device. The thickness of the deposited passivation layer can range from 7 to 100 nm but, is not limited to this range. The passivation layer may be deposited by one of ALD, CVD, PVD, or PECVD but, is not limited to these deposition processes. In various embodiments, the thickness of the passivation determines, at least in part, a resistance of the metal oxide material in the completed resistive switch. For example, the volume of the metal oxide material in RSD 100, as discussed above with reference to FIG. 1, can determine, at least in part, the resistivity of the metal oxide material in RSD 100 and thickness t of metal oxide 4, in some embodiments, is determined by a thickness of the passivation layer.

In an embodiment, a CMP planarizes the top surface of the passivation. In an embodiment, the CMP is used to determine a thickness of the passivation layer. In other embodiments, the deposition process (e.g., CVD, PVD, etc.) controls the thickness of the deposited layer of passivation material.

In step 508, the method includes patterning and selectively etching the passivation layer. Using photolithography and a dry or wet etch process, a portion of the passivation material over the dielectric material is removed. The portion of the passivation material removed can be a round portion, a square portion, an oval portion, a rounded square portion, or any other shape. The size of the portion of the passivation material is controlled. For example, a pre-determined (e.g., by patterning) area of the passivation material is removed (e.g., a pre-determined radius or width and length of the removed portion of the passivation). In this way, a pre-determined or controlled volume of the passivation material is removed. In various embodiments, one of the radius, length, or length and width of the removed passivation material over the dielectric material determines, at least in part, the volume of the metal deposited in the passivation material. For example, the volume of the removed portion of the passivation material is determined by the radius or the length (e.g., distance $l_a$ in FIG. 1) when the shape of the removed portion of the passivation is a circle. The volume of the removed portion of the passivation material is determined by the thickness of the passivation and the area of the removed passivation material. The volume of the removed passivation material and the volume of the metal material deposited in the portion of the removed passivation material can determine, at least in part, the resistance of the metal oxide material in the completed resistive switch device in some embodiments.

In step 510, the method includes depositing a metal layer. The metal layer can be deposited with one of CVD, PVD, ALD, or PECVD but, is not limited to these processes. The metal layer can be composed of any metal suitable for forming a metal oxide in a RRAM. For example, the deposited metal may be W, Ta, Al or Ti but, is not limited to these metals. The deposited metal fills the hole created by the removed portion of the passivation material.

In step 511, a CMP occurs on the top surface of the semiconductor structure. In various embodiments, a CMP removes the excess deposited metal over the top surface of the passivation material. In various embodiments, the CMP removes the metal layer on the top surface of the passivation material. For example, using the top surface of the passivation material as a CMP stop.

Figure 6:
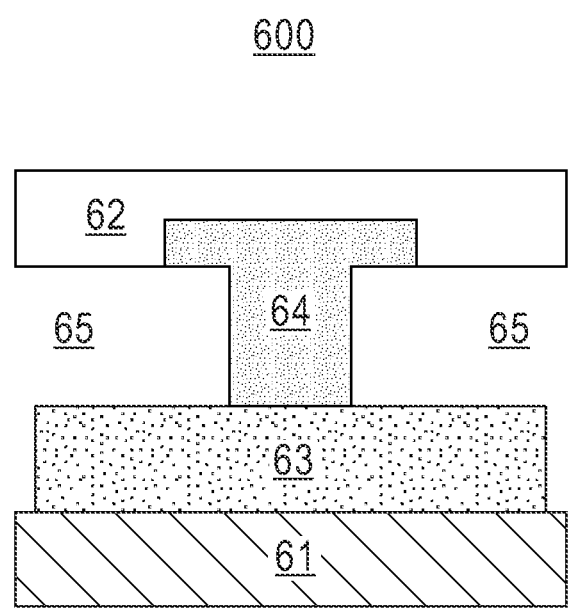
FIG. 6 is a cross-sectional view of a semiconductor structure for another resistive switch device in accordance with an embodiment of the present invention.

In one embodiment, only a portion of the metal layer above the passivation is removed and selective etch of the metal layer occurs. For example, a nail-head shape of the metal remains above the passivation to form a metal oxide as depicted in FIG. 6.

In another embodiment, the CMP removes a top portion of the passivation material and the top portion of the deposited metal. In this embodiment, the CMP determines the thickness of the passivation material and a height of the metal in the portion of the removed passivation material (i.e., the CMP of the deposited metal and a portion of the passivation material determines, at least in part, the resistance of the metal oxide in the completed resistive switch device).

In step 512, the method includes oxidizing the metal layer. For example, the semiconductor structure with the remaining portion of the metal layer can be baked in an oxygen rich or an oxygen environment to oxidize the metal. The bake can occur in an oven at an elevated temperature, ranging from 250 to 400 degrees Celsius for 20 to 60 minutes, for example. The oxidization of the metal creates a metal oxide, such as $WO_x$.

In step 514, the method includes reducing the oxidized metal layer. The sheet resistivity of the metal oxide can be controlled by using a specific reducing process regimen. The sheet resistance of the metal oxide can be varied by as much as three orders of magnitude (as depicted in FIG. 7) by changing the reducing process parameters, such as the temperature, the dwell time, and the environment (e.g., reducing gas composition). In this step, the reducing process parameters can be selected to achieve the desired sheet resistance of the metal oxide. Both the sheet resistance of the metal oxide and using the previous steps, the volume of the metal oxide can be controlled. Controlling the sheet resistance of the metal oxide material by the selected reducing processes and creating the desired volume of the metal oxide by controlling the cross-sectional area of the metal oxide and the depth or height of the metal oxide in the passivation material in steps 506-510, provides a method of controlling the resistance of the metal oxide (i.e., $R_{MO}$) in the RRAM. As previously discussed in detail with respect to FIG. 1, $R_{MO}$ is the largest value that, in most cases, is the determining value for the magnitude or value of the total resistance of the RRAM in RSD 100, therefore, using the steps as discussed with respect to FIG. 5, can essentially control the resistivity of the RRAM in a resistive switch device (e.g., RSD 100).

In step 516, the method includes forming the top electrode. The top electrode can be formed using conventional electrode formation processes as discussed previously in step 502. Using the method of steps 502-16, the resistive switching device can be formed with a controlled and higher resistance using a confined metal oxide in the RRAM rather than a using a blanket of metal oxide that completely covers the dielectric material. The resistive switch device formed using step 514 can have a total RRAM resistance that can further controlled by the reducing process selected.

FIG. 6 is a cross-sectional view of RSD 600 in accordance with an embodiment of the present invention. As depicted, RSD 600 includes bottom electrode 61, dielectric material 63, metal oxide 64, passivation 65, and top electrode 62. Bottom electrode 61, dielectric material 63, metal oxide 64, passivation 65, and top electrode 62 are essentially the same as bottom electrode 1, dielectric material 3, metal oxide 4, passivation 5, and top electrode 2 in FIG. 1 with the exception of metal oxide 64 and top electrode 62. In RSD 600, metal oxide 64 extends into top electrode 62 and over a portion of passivation 65.

As depicted in FIG. 6, metal oxide 64 has a wider top portion that protrudes into top electrode 62 and provides more metal oxide 64 surface area in contact with top electrode 62. For example, with more of metal oxide 64 in contact with top electrode 62, an oxygen scavenging effect may reduce the metal oxide material to increase metal oxide 64 conductivity.

RSD 600 can be formed, for example, using the processes discussed in detail later with respect to FIG. 5 with the following changes. After depositing the metal layer in step 510, CMP may planarize the surface of the deposited metal layer but leaves a portion of the metal material over passivation 65. A selective etch of exposed portions of the metal material occurs using conventional photolithography and either a dry (e.g., reactive ion etch) or a wet etch using passivation 65 as an etch stop. After patterning and selectively removing the desired portions of the metal material on passivation 45, an oxidation process (e.g., step 512 in FIG. 5) occurs forming metal oxide 64. In addition, after the oxidation process a reduction process (e.g., step 516 of FIG. 5) can occur. Top electrode 62 can be formed over exposed surfaces of passivation 65 and metal oxide 64 above the top surface of passivation 65 using convention electrode formation processes (e.g. step 516 in FIG. 5). Using this method, the t-shaped or nail shaped portion of the metal oxide material remains as metal oxide 64. Metal oxide 64 provides more surface contact area with top electrode 62 than metal oxide 4 as depicted in FIG. 1.

In an alternative embodiment to form the resistive switch device, after etching the dielectric material in step 504, a metal layer is deposited on the dielectric material. The semiconductor substrate can be baked in an oxygen environment to oxidize the metal layer. After the oxidation of the metal layer, a reduction process occurs to reduce the oxidized metal layer. The oxidized metal layer is then, patterned and etched exposing a portion of the dielectric material and in some cases, a portion of the bottom electrode. A passivation material is deposited over the exposed dielectric material, any exposed portions of the bottom electrode, and around the remaining portion of the reduced metal oxide. A top electrode can be formed over a portion of the passivation material and over the top surface of the reduced, metal oxide material.

FIG. 7 depicts examples of the sheet resistance of a metal oxide material in the resistive switch device with the reduction processes creating the sheet resistance in accordance with an embodiment of the present invention. As depicted, FIG. 7 includes the sheet resistance of the metal oxide in Ω/sq and the post-oxidation reducing treatment for the metal oxide.

As depicted in the first row of FIG. 7, a high metal oxide sheet resistance may be attained with one or more post-oxidation reduction processes. The post-oxidation processes in the first row of FIG. 7 include a reducing bake (e.g., to reduce the metal oxide material) occurring in a low hydrogen reducing gas followed by a low temperature bake without the reducing gas. For example, the low hydrogen reducing gas can be composed of a hydrogen and argon reducing gas. The reducing bake can occur at 150 deg. C. for 10 to 30 minutes in the low hydrogen reducing gas. After the reducing bake, another low temperature bake can occur without the low hydrogen reducing gas in an oxygen-free environment. For example, the second bake without the low hydrogen reducing gas occurs at a low temperature, such as 150 deg. C. for 10 to 15 minutes. After the post-oxidation reduction processes that includes the reducing bake and a second low temperature bake, the metal oxide sheet resistance can range from $5 \times 10^6$ to $10 \times 10^6$ ohm/sq as depicted in the first column of the first row of FIG. 7.

As depicted in the second row of FIG. 7, a less high metal oxide sheet resistance may be attained with one or more post-oxidation reduction processes. The post-oxidation processes in the second row of FIG. 7 include a reducing bake (e.g., to reduce the metal oxide material) occurring in a medium hydrogen reducing gas followed by a low temperature bake without the medium hydrogen reducing gas. For example, the medium hydrogen reducing gas can be composed of a hydrogen and argon reducing gas with a slightly higher hydrogen content than the low hydrogen reducing gas. The reducing bake can occur at 150 deg. C. for 10 to 30 minutes in the medium hydrogen reducing gas. After the reducing bake, another low temperature bake can occur without the medium hydrogen reducing gas in an oxygen-free environment. For example, the second bake without the medium hydrogen reducing gas occurs at a low temperature, such as 150 deg. C. for 10 to 30 minutes. After the post-oxidation reduction processes that includes the reducing bake and a second low temperature bake, the metal oxide sheet resistance can range from $5 \times 10^5$ to $8 \times 10^5$ Ω/sq as depicted in the first column of the first row of FIG. 7.

As depicted in the third row of FIG. 7, an even less high metal oxide sheet resistance may be attained with one or more post-oxidation reduction processes. The post-oxidation processes in the third row of FIG. 7 include a reducing bake (e.g., to reduce the metal oxide material) occurring in a higher hydrogen reducing gas followed by a low temperature bake without the higher hydrogen reducing gas and then, a vacuum anneal. For example, the higher hydrogen reducing gas can be composed of a hydrogen and argon reducing gas with a slightly higher hydrogen content than the medium hydrogen reducing gas. The reducing bake can occur at 150 deg. C. for 10 to 30 minutes in the higher hydrogen reducing gas. After the reducing bake, another low temperature bake can occur without the reducing gas that is followed by an anneal. For example, the second bake without the higher hydrogen reducing gas occurs at a low temperature, such as 150 deg. C. for 10 to 20 minutes. After the post-oxidation reduction processes that includes the reducing bake, a second low temperature bake, and a vacuum anneal, the metal oxide sheet resistance can range from $1 \times 10^5$ to $8 \times 10^5$ Ω/sq as depicted in the first column of the third row of FIG. 7.

Figure 8:
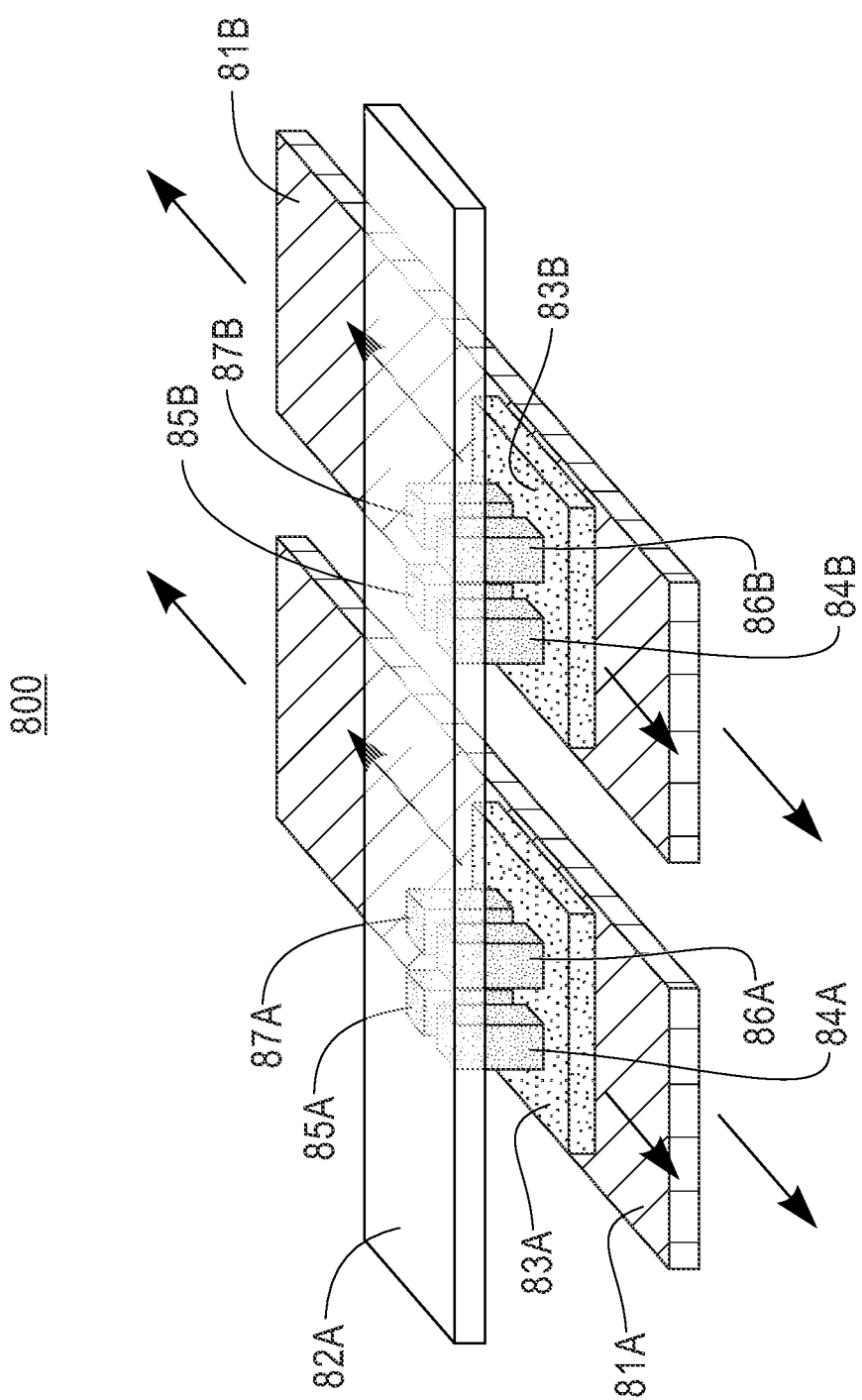
FIG. 8 is a transparent three-dimensional projection view of the semiconductor structure of a portion of a crossbar array using a number of resistive switch devices in accordance with an embodiment of the present invention.

FIG. 8 is a transparent three-dimensional projection of crossbar array 800 of a plurality of RSD devices 84A-87A and 84B-87B in accordance with an embodiment of the present invention. As depicted, FIG. 8 includes crossbar array 800 with bottom electrodes 81A and 81B, dielectric material 83A and 83B, metal oxide elements 84A, 85A, 88A, 87A, 84B, 85B, 88B, and 87B, and top electrode 82A. The passivation surrounding each of metal oxide elements in RSD devices 84A-87A and 84B-87B between bottom electrodes 81A and 81B and top electrode 82A is not depicted in FIG. 8. In FIG. 8, a single memristor or a resistive switch device can be composed of bottom electrode 81A under dielectric material 83A with metal oxide element 84A connecting to top electrode 82A. As known to one skilled in the art, crossbar array 800 depicts a portion of crossbar array which may include many crossbar arrays 800.

As depicted, FIG. 8, includes crossbar array 800 with four RRAMs composed of four metal oxide elements, such as 84A-87A on dielectric material 83A connecting bottom electrode 81A to top electrode 82A and another four RRAMs composed of four metal oxide elements, such as 84B-87B on dielectric material 83B connecting bottom electrode 81B to top electrode 82A. As depicted dielectric material 84A and 83B and bottom electrodes 81A and 81B can continue to extend (e.g., both into and out of the paper). Similarly, as depicted, top electrode 82 can extend to the left and right. As known to one skilled in the art, crossbar array 800 can be a portion of a larger crossbar array. For example, five of crossbar arrays 800 can be connected together to form a larger crossbar array.

While FIG. 8 depicts eight memristors as two four by four memristor arrays on bottom electrodes 81A and 81B to a single top electrode (e.g., top electrode 82A). In other embodiments, any number of memristors can be memristor arrays composed of an number of memristors (e.g., two by two or five by five memristor arrays) on any number bottom electrodes and connecting to any number of top electrodes to form a crossbar array of memristors. For example, as known to one skilled in the art, using a large number of RSD 100 formed with minor variations of the processes discussed above to create multiple RSD 100, depicted in FIG. 1, connected to multiple bottom and top electrodes, larger crossbar arrays with the same or a different number of RSD 100 can be formed on any number of bottom electrodes and connected top electrodes.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A resistive switch device, the resistive switch device comprising:
    a bottom electrode;
    a dielectric material over the bottom electrode, wherein:
        a bottom surface of the dielectric material contacts a top surface of the bottom electrode; and
        the bottom surface of the dielectric material has a surface area smaller than the top surface of the bottom electrode; and
    a metal oxide material on a portion of the dielectric material connecting to a portion of a top electrode.

2. The resistive switch device of claim 1, wherein the metal oxide material on the portion of the dielectric material has a controlled area.

3. The resistive switch device of claim 1, wherein the metal oxide on the portion of the dielectric material has a volume that is reduced to increase a resistance of the metal oxide material in the resistive switch device.

4. The resistive switch device of claim 1, wherein the metal oxide material on the portion of the dielectric material provides a largest portion of a total resistance of a resistive random-access memory.

5. The resistive switch device of claim 3, wherein the volume of the metal oxide material is determined by an area of the metal oxide on the portion of the dielectric material and a controlled thickness of the metal oxide material.

6. The resistive switch device of claim 1, wherein the metal oxide material on the portion of the dielectric material has a controlled resistivity.

7. The resistive switch device of claim 6, wherein the controlled resistivity of the metal oxide material is determined, at least in part, by one or more post-oxidation reduction processes.

8. The resistive switch device of claim 7, wherein the one or more post-oxidation reduction processes include one or more of a reducing bake process, a low temperature bake, and an anneal.

9. The resistive switch device of claim 6, wherein the controlled resistivity of the metal oxide material is determined, at least in part, by a volume of the metal oxide material.

10. The resistive switch device of claim 1, wherein the resistive switch device is in an OFF state when the metal oxide material has a high resistance and when a filament in the dielectric material over the bottom electrode is thick.

11. The resistive switch device of claim 10, wherein the metal oxide material has the high resistance with a high oxygen content in the metal oxide material.

12. The resistive switch device of claim 10, wherein the resistive switch is in an SET state when the metal oxide material has a low resistance and when the filament in the dielectric material over the bottom electrode is thin.

13. A crossbar array of resistive switch devices, the crossbar array comprising:
    a first resistive switch device comprising:
        a first plurality of metal oxide elements on a first dielectric material layer; and
        the first dielectric material layer on a first bottom electrode;
    a second resistive switch device comprising:
        a second plurality of metal oxide elements on a second dielectric material layer; and
        the second dielectric material layer on a second bottom electrode; and
    a top electrode connecting the first resistive switch device to the second resistive switch device.

14. The crossbar array of claim 13, further comprising a passivation surrounding each of the first resistive switch device and the second of resistive switch device.

15. The crossbar array of claim 13, wherein:
    each of the metal oxide elements has a controlled thickness and a controlled electrical resistance; and
    the first dielectric material layer is capable of forming a conductive filament connecting the first bottom electrode to a metal oxide element of the first plurality of metal oxide elements.

16. A method of forming a resistive switch device, the method comprising:
    forming a bottom electrode in a metal layer;
    depositing a layer of a dielectric material, wherein the dielectric material is capable of generating a conduction path with an applied electric field;
    selectively etching the dielectric material such that a bottom surface of the dielectric material contacting a top surface of the bottom electrode has a surface area smaller than the top surface of the bottom electrode;
    depositing a passivation material;
    selectively etching the passivation material to expose a portion of the dielectric material;
    depositing a metal layer on the exposed portion of the dielectric material and over the passivation material;

oxidizing the metal layer forming a metal oxide material;
reducing the metal oxide material; and
performing a chemical-mechanical polish to remove excess metal oxide material; and
forming a top electrode.

17. The method of claim 16, wherein selectively etching the passivation material to expose the portion of the dielectric material determines, at least in part, a resistivity of the metal oxide material in a resistive switch device.

18. The method of claim 16, wherein reducing the metal oxide material determines, at least in part, the resistivity of the metal oxide material in a resistive switch device.

19. The method of claim 16, wherein reducing the metal oxide material includes a process selected from the group consisting of: a bake in a low hydrogen reducing environment, a bake in a medium hydrogen reducing environment, a bake in a high hydrogen reducing environment, a bake without the reducing environment, and an anneal.

20. The method of claim 16, wherein the metal oxide material is a tungsten oxide.

* * * * *